(12) United States Patent
Kim et al.

(10) Patent No.: US 8,017,947 B2
(45) Date of Patent: Sep. 13, 2011

(54) THIN FILM TRANSISTOR ARRAY PANEL, DISPLAY DEVICE INCLUDING THE SAME, AND METHOD THEREOF

(75) Inventors: Yong-Jo Kim, Gwangmyeong-si (KR); Young-Goo Song, Cheonan-si (KR); Young-Je Cho, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 211 days.

(21) Appl. No.: 12/270,068

(22) Filed: Nov. 13, 2008

(65) Prior Publication Data

US 2009/0184318 A1 Jul. 23, 2009

(30) Foreign Application Priority Data

Jan. 23, 2008 (KR) .................. 10-2008-0007245

(51) Int. Cl.
*H01L 27/12* (2006.01)
(52) U.S. Cl. ..... 257/59; 257/72; 257/758; 257/E21.536; 257/E21.07
(58) Field of Classification Search .................... 257/59, 257/72, 758; 349/38
See application file for complete search history.

(56) References Cited

U.S. PATENT DOCUMENTS

2007/0134858 A1* 6/2007 Ryu et al. ................. 438/149
2007/0279542 A1* 12/2007 Kim et al. ................. 349/38

* cited by examiner

*Primary Examiner* — A. Sefer
(74) *Attorney, Agent, or Firm* — Cantor Colburn LLP

(57) ABSTRACT

A thin film transistor ("TFT") array panel according to an exemplary embodiment of the present invention includes a substrate, a first storage electrode formed on the substrate, a first TFT formed on the substrate and separated from the first storage electrode, a first insulating layer formed on the first storage electrode and the first TFT and having a first opening disposed on the first storage electrode, a pixel electrode connected to the first TFT and overlapping the first storage electrode in the first opening, and a second insulating layer disposed between the first storage electrode and the pixel electrode in the first opening, wherein at least a portion of the boundary of the pixel electrode overlaps the first storage electrode and is disposed in the first opening. Accordingly, storage appropriate capacitance is ensured and a reduction of the aperture ratio may be decreased.

21 Claims, 7 Drawing Sheets

ABSTRACT continues...

THIN FILM TRANSISTOR ARRAY PANEL, DISPLAY DEVICE INCLUDING THE SAME, AND METHOD THEREOF

This application claims priority to Korean Patent Application No. 10-2008-0007245, filed on Jan. 23, 2008, and all the benefits accruing therefrom under 35 U.S.C. §119, the contents of which in its entirety are herein incorporated by reference.

BACKGROUND OF THE INVENTION (a) Field of the Invention The present invention relates to a thin film transistor ("TFT") array panel, display device including the same, and method thereof. More particularly, the present invention relates to a TFT array panel decreasing an aperture ratio reduction and ensuring appropriate storage capacitance, a display device including the TFT array panel, and a method thereof.

(b) Description of the Related Art

Liquid crystal displays ("LCDs") are now widely used, as one type of flat panel display. An LCD has two display panels on which field generating electrodes, such as pixel electrodes and a common electrode, are formed, and a liquid crystal layer that is interposed between the display panels. The LCD applies voltages to the field generating electrodes so as to generate an electric field in the liquid crystal layer, which in turn determines the alignment of liquid crystal molecules of the liquid crystal layer and thus the polarization of incident light, thereby performing image display.

The LCD also includes a plurality of thin film transistors ("TFTs") connected to the pixel electrodes, a plurality of signal lines for controlling the TFTs, and a plurality of color filters for representing colors. The color filters are made of organic materials including pigments, and recently, they are frequently formed on a display panel having the TFT.

The LCD also includes storage electrodes forming storage capacitors along with the pixel electrodes. When the color filters and the storage electrodes are formed on a display panel, the storage electrodes are disposed opposite the pixel electrodes with respect to the color filters. The color filters representing different colors may include different materials and thus they may be formed by different manufacturing processes. Thus, the thickness or the permittivity may be different between different color filters such that the storage capacitances related thereto may be different.

To solve this problem, a method for forming openings in the color filters in the areas where the pixel electrodes and the storage electrodes overlap each other has been proposed.

BRIEF SUMMARY OF THE INVENTION

It has been determined herein, according to the present invention, that light leakage may generate near the openings of color filters of a conventional display panel, and blocking of the light leakage may reduce the aperture ratio.

The present invention therefore provides a thin film transistor ("TFT") array panel and a display device including the same that decreases the reduction of the aperture ratio and ensures an appropriate storage capacitance.

The present invention also provides a method of forming a TFT array panel to decrease reduction of the aperture ratio and ensure an appropriate storage capacitance.

A TFT array panel according to exemplary embodiments of the present invention includes a substrate, a first storage electrode formed on the substrate, a first TFT formed on the substrate and separated from the first storage electrode, a first insulating layer formed on the first storage electrode and the first TFT and having a first opening disposed on the first storage electrode, a pixel electrode connected to the first TFT and overlapping the first storage electrode in the first opening, and a second insulating layer disposed between the first storage electrode and the pixel electrode in the first opening, wherein at least a portion of a boundary of the pixel electrode overlaps the first storage electrode and is disposed in the first opening.

The first insulating layer may be a color filter.

At least a portion of a boundary of the first opening may overlap the first storage electrode.

Boundaries of the overlapping region between the pixel electrode and the first storage electrode in the first opening may be formed by boundaries of the pixel electrode, and boundaries of the first storage electrode may be disposed outside the first opening.

At least a portion of a boundary of the first storage electrode may be disposed in the first opening.

The overlapping region between the first storage electrode and the pixel electrode may form a closed region in the first opening.

The TFT array panel may further include a connection connected to the first storage electrode, the connection having a narrower width than the first storage electrode, and overlapping the boundary of the first opening.

The overlapping region between the first storage electrode and the pixel electrode, the first opening, and the first storage electrode may be substantially a rectangle, and the overlapping region may be disposed in the first opening.

The pixel electrode may include a first portion overlapping the first opening and having a rectangle, a second portion disposed outside the first opening, and a third portion connecting the first portion and the second portion to each other and having a narrower width than the first portion.

The first portion of the pixel electrode may be disposed in the first opening, and boundaries of the first opening may be disposed within boundaries of the first storage electrode.

The overlapping region between the first storage electrode and the pixel electrode may be formed by three edges of the first portion of the pixel electrode and one edge of the first storage electrode.

The overlapping region between the first storage electrode and the pixel electrode may be formed by opposite two edges of the first portion of the pixel electrode and opposite two edges of the first storage electrode.

The second portion of the pixel electrode may have an edge parallel to one edge of the first opening and overlapping the first storage electrode.

The third portion of the pixel electrode may be covered by the first storage electrode.

The pixel electrode may further include a first sub-pixel electrode connected to the first TFT and overlapping the first storage electrode in the first opening, and a second sub-pixel electrode separated from the first sub-pixel electrode.

The TFT array panel may further include a second storage electrode connected to the first storage electrode and overlapping with the second sub-pixel electrode, and a second TFT separated from the second storage electrode and connected to the second sub-pixel electrode, wherein the first insulating layer may have a second opening disposed on the second storage electrode, and the second insulating layer may be disposed between the second storage electrode and the second sub-pixel electrode in the second opening.

The boundary of the second sub-pixel electrode may be disposed outside boundaries of the second opening.

The width of the first storage electrode may be larger than the width of the second storage electrode, and the length of the first storage electrode may be smaller than the length of the second storage electrode.

One boundary of the first storage electrode may be overlapped by a boundary of the first opening, and the second storage electrode and the first storage electrode may be connected to each other through a connection having a narrower width than the second storage electrode and extended from the boundary of the first storage electrode.

The width of the second storage electrode may be the same as a width of the first storage electrode.

The voltage of the first sub-pixel electrode and the voltage of the second sub-pixel electrode may be derived from one image information input from the external, and the voltage of the first sub-pixel electrode may be higher than the voltage of the second sub-pixel electrode with reference to a predetermined voltage.

The first sub-pixel electrode may have a smaller area than the second sub-pixel electrode.

A display device according to exemplary embodiments of the present invention includes a common electrode panel including a first substrate and a common electrode formed on the first substrate, and a TFT array panel including a second substrate, a first storage electrode disposed on the second substrate, a first TFT disposed on the second substrate and separated from the first storage electrode, a first insulating layer disposed on the first storage electrode and the first TFT and having a first opening disposed on the first storage electrode, a pixel electrode connected to the first TFT and overlapping the first storage electrode in the first opening, and a second insulating layer interposed between the first storage electrode and the pixel electrode in the first opening, wherein at least one boundary of the pixel electrode overlaps the first storage electrode and lies in the first opening.

A method of forming a TFT array panel according to exemplary embodiments of the present invention includes disposing a first storage electrode on a substrate, forming a first TFT on the substrate separated from the first storage electrode, disposing a color filter layer on the first storage electrode and the first TFT with a first opening disposed on the first storage electrode, connecting a pixel electrode to the first TFT and overlapping at least one boundary of the pixel electrode on the first storage electrode within the first opening, and interposing an insulating layer between the first storage electrode and the pixel electrode in the first opening.

In this way, at least a portion of the boundary of the pixel electrode is disposed in the opening when designing the storage capacitor such that the storage electrodes cover the light leakage generated near the corresponding portion without accompanying the light blocking member of the common electrode panel. Accordingly, the aperture ratio is improved.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF THE INVENTION

Figure 1:
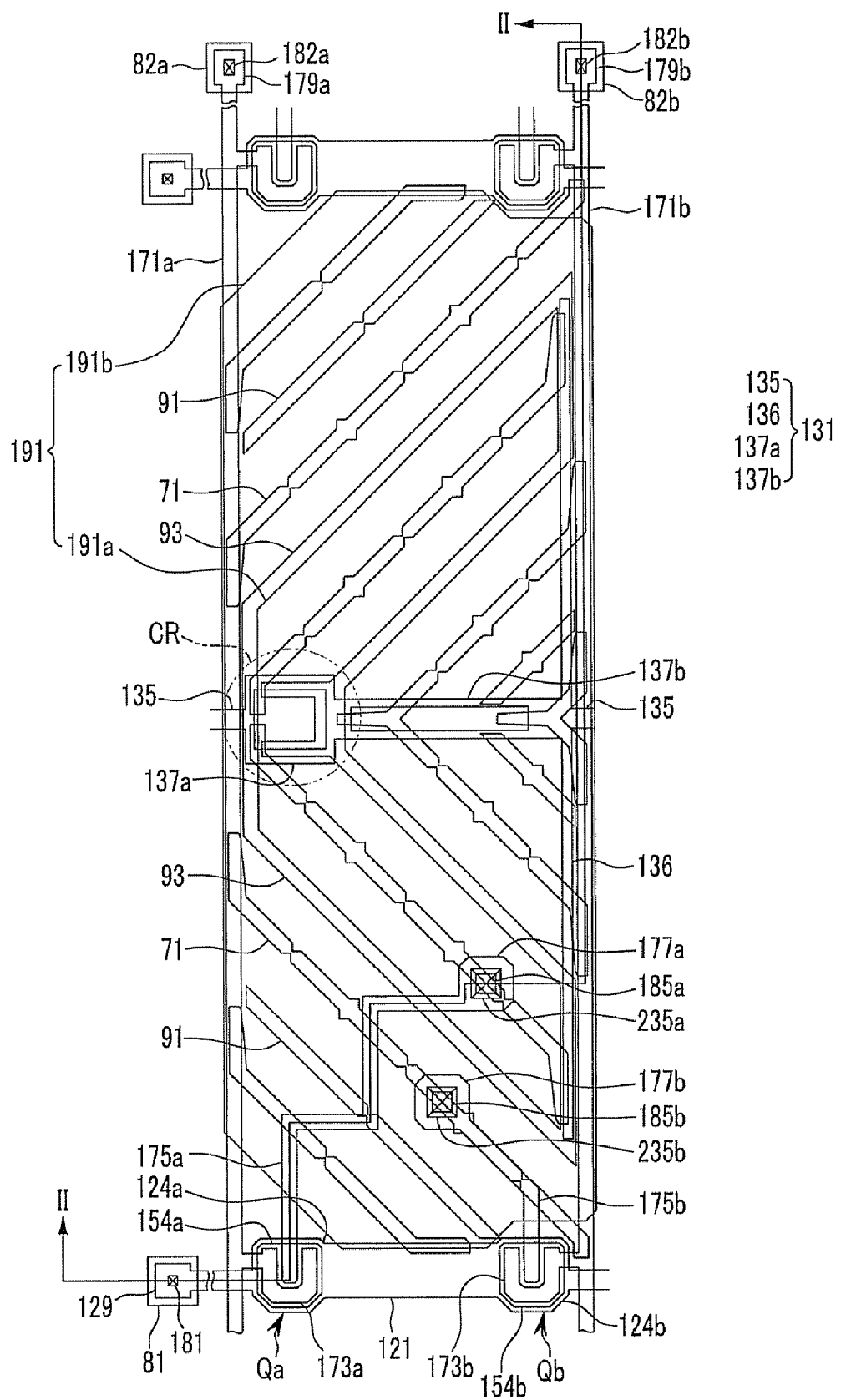
FIG. 1 is a layout view of an exemplary liquid crystal display ("LCD") according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Now, a liquid crystal display ("LCD") according to an exemplary embodiment of the present invention will be described in detail with the reference to FIG. 1 to FIG. 4.

Figure 2:
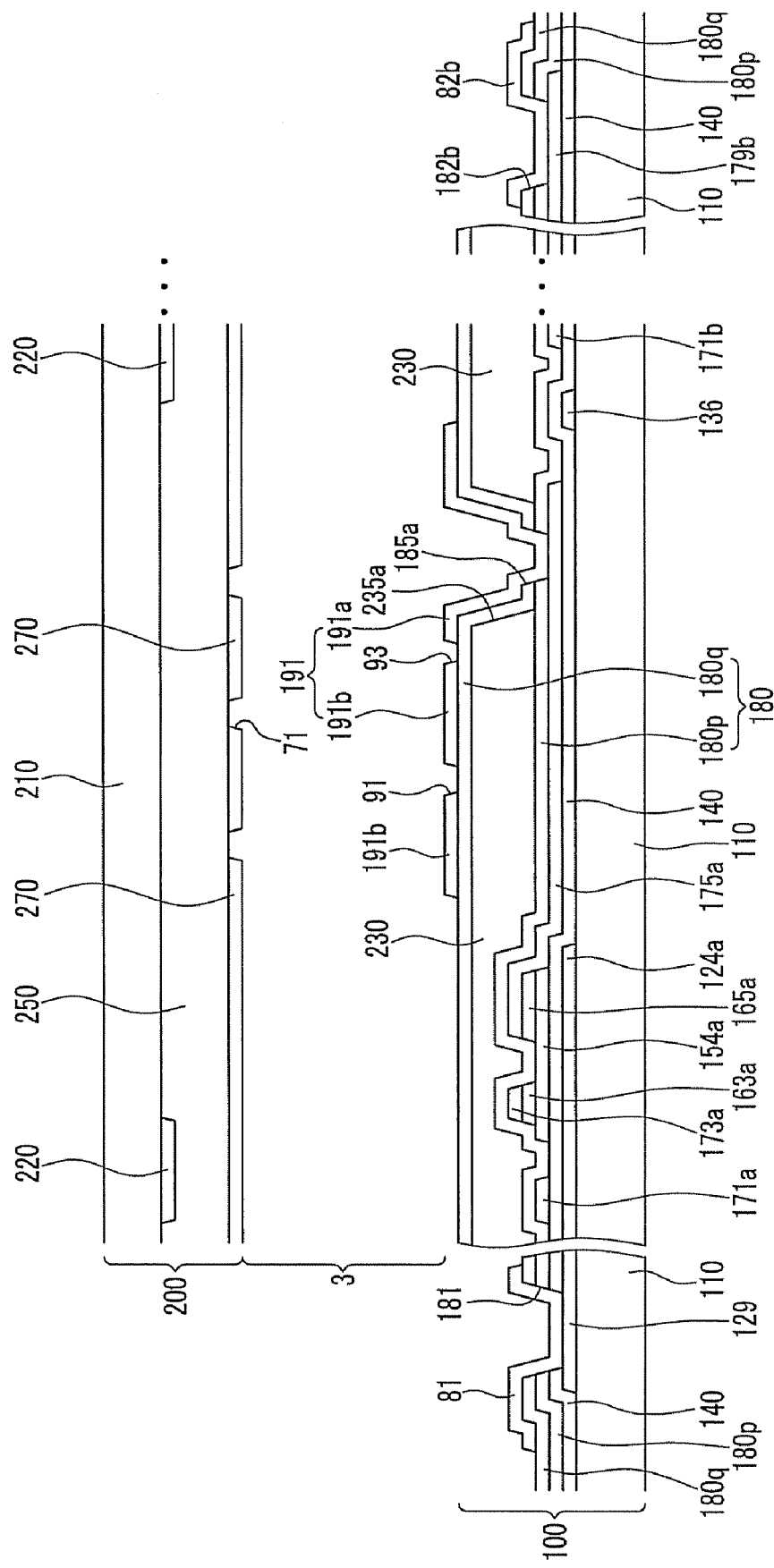
FIG. 2 is a cross-sectional view of the exemplary LCD shown in FIG. 1 taken along line II-II.
Figure 3:
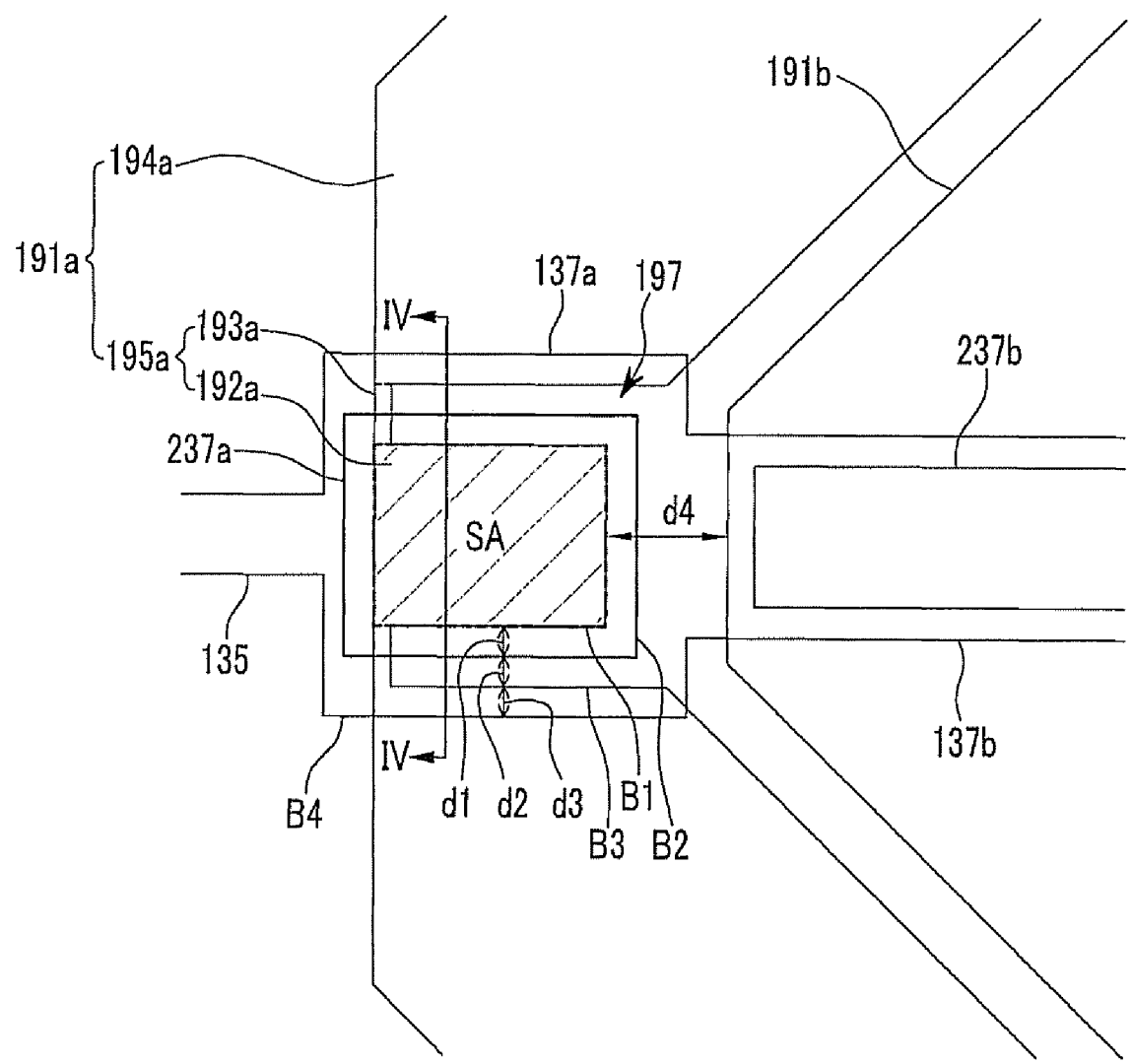
FIG. 3 is an enlarged view of portion CR shown in FIG. 1.
Figure 4:
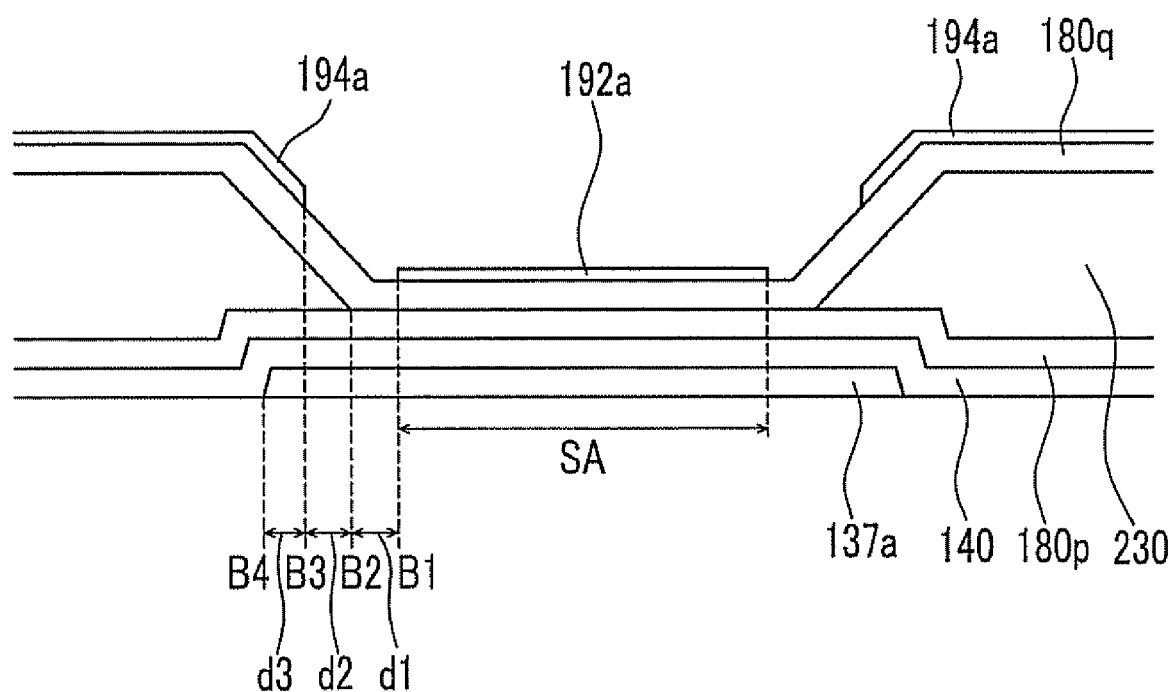
FIG. 4 is a cross-sectional view of portion CR shown in FIG. 3 taken along line IV-IV; and, FIG. 5 to FIG. 7 are layout views of an exemplary storage capacitor in an exemplary LCD according to other exemplary embodiments of the present invention.

FIG. 1 is a layout view of an exemplary LCD according to an exemplary embodiment of the present invention, FIG. 2 is a cross-sectional view of the exemplary LCD shown in FIG. 1 taken along line II-II, FIG. 3 is an enlarged view of a portion denoted by CR shown in FIG. 1, and FIG. 4 is a cross-sectional view of portion CR shown in FIG. 3 taken along line IV-IV.

Referring to FIG. 1 to FIG. 4, an exemplary LCD according to an exemplary embodiment of the present invention includes a thin film transistor ("TFT") array panel 100 and a common electrode panel 200 that face each other, and a liquid crystal layer 3 interposed between the two display panels 100 and 200.

The liquid crystal layer 3 may have negative dielectric anisotropy, and liquid crystal molecules of the liquid crystal layer 3 may be aligned such that their major axes are perpendicular to the surfaces of the two panels in absence of an electric field.

Alignment layers (not shown) may be applied on inner surfaces of the panels 100 and 200, and they may be homeotropic. At least one polarizer (not shown) may be attached on outer surfaces of the panels 100 and 200.

Firstly, the common electrode panel 200 will be described.

A light blocking member 220 is formed on an insulation substrate 210 that is made of a material such as transparent glass or plastic. The light blocking member 220 is also referred to as a black matrix and blocks light leakage.

An overcoat 250 is formed on the substrate 210 and the light blocking member 220. The overcoat 250 may be made of an insulating material, such as an organic insulating material, and may be omitted in alternative embodiments.

A common electrode 270 is formed on the overcoat 250. The common electrode 270 is made of a transparent conductor such as indium tin oxide ("ITO") or indium zinc oxide ("IZO"), and receives a common voltage. The common electrode 270 has a plurality of cutouts 71. Each of the cutouts 71 has at least one oblique portion extending obliquely, and each oblique portion may have a plurality of concave or convex notches.

Next, the TFT array panel 100 will be described.

A plurality of gate lines 121 and a plurality of storage electrode lines 131 are formed on an insulating substrate 110 that may be made of transparent glass or plastic.

The gate lines 121 extend substantially in a transverse direction and transmit gate signals. Each of the gate lines 121 includes a plurality of first and second gate electrodes 124a and 124b protruding upward and downward in directions towards adjacent gate lines 121 or protruding in one of the upward and downward directions, and an end portion 129 having a large area for contact with another layer or an external driving circuit.

The storage electrode lines 131 extend substantially parallel to the gate lines 121, and are supplied with a predetermined voltage. Each of the storage electrode lines 131 is disposed between two neighboring gate lines 121 and each of the storage electrode lines 131 is nearly equidistant from two neighboring gate lines 121. The storage electrode line 131 includes a first storage electrode 137a, a second storage electrode 137b, a branch electrode 136, and a connection 135. The first and second storage electrodes 137a and 137b are approximately rectangular and are joined to each other. In an exemplary embodiment, the transverse length of the first storage electrode 137a is shorter than that of the second storage electrode 137b, and the longitudinal length of the first storage electrode 137a is longer than that of the second storage electrode 137b. The branch electrode 136 is connected to an end of the second storage electrode 137b and extends in a longitudinal direction to approach the gate line 121. The transverse length of the branch electrode 136 is very small. The connection 135 connects the branch electrode 136 to a neighboring first storage electrode 137a, and the longitudinal length thereof is small compared with the first and second storage electrodes 137a and 137b. While a particular arrangement has been described, it should be understood that the shapes and arrangement of the storage electrode lines 131 can be modified in various forms.

A gate insulating layer 140 that may be made of silicon nitride (SiNx) or silicon oxide (SiOx) is formed on the gate lines 121 and the storage electrode lines 131 and on exposed portions of the insulation substrate 110.

A plurality of first semiconductor islands 154a and second semiconductor islands 154b that may be made of hydrogenated amorphous silicon ("a-Si") or polysilicon are formed on the gate insulating layer 140. The first semiconductor islands 154a overlap the first gate electrodes 124a and the second semiconductor islands 154b overlap the second gate electrodes 124b.

A pair of first ohmic contact islands 163a and 165a are formed on the first semiconductor islands 154a, and a pair of second ohmic contact islands (not shown) are formed on the second semiconductor islands 154b. The ohmic contacts 163a and 165a may be formed of n+ hydrogenated a-Si heavily doped with an n-type impurity, or they may be made of silicide.

A plurality of first and second data lines 171a and 171b and a plurality of first and second drain electrodes 175a and 175b are formed on the first ohmic contacts 163a and 165a, the second ohmic contacts, and the gate insulating layer 140.

The first and the second data lines 171a and 171b transmit data voltages, extend substantially in the longitudinal direction to intersect the gate lines 121 and the connections 135 of the storage electrode lines 131. The first data line 171a includes a first source electrode 173a extending toward the first gate electrode 124a and which may be curved like a character "U", and an end portion 179a having a wide area for contact with another layer or an external driving circuit. Likewise, the second data line 171b includes a second source electrode 173b extending toward the second gate electrode 124b and which may be curved like a character "U", and an end portion 179b having a wide area for contact with another layer or an external driving circuit.

The drain electrodes 175a and 175b are separated from the data lines 171a and 171b. Each of the drain electrodes 175a and 175b starts from one end portion partly enclosed by the source electrode 173a or 173b and ends at the other end portion, wide end portions 177a and 177b, respectively, having a wide area.

The first/second gate electrode 124a/124b, the first/second source electrode 173a/173b and the first/second drain electrode 175a/175b along with the first/second semiconductor island 154a/154b form a first/second TFT Qa/Qb having a channel formed in the first/second semiconductor island 154a/154b disposed between the first/second source electrode 173a/173b and the first/second drain electrode 175a/175b.

The first ohmic contacts 163a and 165a and second ohmic contacts are interposed only between the underlying semiconductor islands 154a and 154b, and the overlying data lines 171a and 171b and drain electrodes 175a and 175b, and reduce contact resistance between them. The semiconductor islands 154a and 154b include some exposed portions that are not covered with the data lines 171a and 171b and the drain electrodes 175a and 175b, such as portions located between the source electrodes 173a and 173b and the drain electrodes 175a and 175b.

A passivation layer 180 is formed on the data lines 171a and 171b, the drain electrodes 175a and 175b, and the exposed portions of semiconductor islands 154a and 154b and exposed portions of the gate insulating layer 140. The passivation layer 180 includes a lower film 180p that may be made of an inorganic insulator such as silicon nitride or silicon oxide, and an upper film 180q. In an alternative exemplary embodiment, at least one of the lower film 180p and the upper film 180q may be omitted.

The passivation layer 180 has a plurality of contact holes 182a and 182b respectively exposing the end portions 179a and 179b of the data lines 171a and 171b, and a plurality of contact holes 185a and 185b respectively exposing the wide end portions 177a and 177b of the drain electrodes 175a and 175b. The passivation layer 180 and the gate insulating layer 140 have a plurality of contact holes 181 exposing the end portions 129 of the gate lines 121.

In an exemplary embodiment where the passivation layer 180 includes the upper film 180q and the lower film 180p, a plurality of color filters 230 are formed between the lower film 180p and the upper film 180q. The color filters 230 are disposed between the first data lines 171a and the second data lines 171b, and may be elongated in a longitudinal direction to form a stripe. The boundary of two neighboring color filters 230 may be disposed between two nearest data lines 171a and 171b such that the two color filters 230 overlap each other to serve as a light blocking member blocking light leakage generated between the pixel electrodes 191. When the color filters 230 overlap each other, the light blocking member 220 of the common electrode panel 200 may be omitted.

The color filters 230 may each represent one color in a set of colors, such as primary colors, and the set of colors may include red, green, and blue, and the color filters 230 may be made of a photosensitive organic material including pigments.

The color filters 230 have through holes 235a and 235b through which the contact holes 185a and 185b pass. The through holes 235a and 235b are larger than the contact holes 185a and 185b. The color filters 230 further have a first rectangular opening 237a disposed on the first storage electrode 137a, and a second rectangular opening 237b disposed on the second storage electrode 137b. In a top view, as shown in FIG. 3, the first opening 237a is covered by the first storage electrode 137a and the second opening 237b is covered by the second storage electrode 137b, such that light leakage generated at the openings 237a and 237b is reduced. The color filters 230 do not exist in a peripheral area where the end portions 129 of the gate lines 121 and the end portions 179a and 179b of the data lines 171a and 171b are disposed.

A pixel electrode 191 and contact assistants 81, 82a, and 82b are formed on the upper film 180q of the passivation layer 180. The pixel electrode 191 and the contact assistants 81, 82a and 82b may be made of a transparent conductive material such as ITO or IZO, or a reflective metal such as aluminum, silver, chromium, or alloys thereof.

The contact assistants 81, 82a, and 82b are connected to the end portions 129 of the gate lines 121 and the end portions 179a and 179b of the data lines 171 through the contact holes 181, 182a, and 182b, respectively. The contact assistants 81, 82a, and 82b protect the end portions 129, 179a, and 179b and enhance the adhesion of the end portions 129, 179a, and 179b and external devices.

The pixel electrode 191 is approximately formed in the shape of a rectangle having four main edges nearly parallel to the gate lines 121 or the data lines 171a and 171b, as well as chamfered left corners. The chamfered edges of the pixel electrodes 191 make an angle of about 45 degrees with the gate line 121.

The pixel electrode 191 includes a first sub-pixel electrode 191a and a second sub-pixel electrode 191b larger than the first sub-pixel electrode 191a.

The first sub-pixel electrode 191a has a band shape formed approximately in the shape of a less-than sign (<), and is enclosed by the second sub-pixel electrode 191b via a gap 93 interposed therebetween. The second sub-pixel electrode 191b has a plurality of cutouts 91 with a straight band shape and the cutouts 91 make an angle of about 45 degrees with the gate lines 121 and the data lines 171a and 171b. The gap 93 includes a plurality of oblique portions substantially parallel to the cutouts 91, and a plurality of longitudinal portions substantially parallel to the data lines 171a and 171b. The cutouts 91 and the gap 93 are alternately arranged with the cutouts 71 of the common electrode 270.

The first/second sub-pixel electrode 191a/191b is connected to the first/second drain electrode 175a/175b of the first/second TFT Qa/Qb through the contact hole 185a/185b such that it receives data voltages from the first/second drain electrode 175a/175b. The first/second sub-pixel electrode 191a/191b supplied with the data voltages generate electric fields along with the common electrode 270 of the common electrode panel 200, which determine the orientations of the liquid crystal molecules of the liquid crystal layer 3 disposed between the electrodes 191a/191b and 270. Accordingly, the luminance of the light transmitted through the liquid crystal layer 3 differs depending on the determined orientation of the liquid crystal molecules.

The first TFT Qa, and the first sub-pixel electrode 191a, and the liquid crystal layer 3, the common electrode 270, and the polarizer that are disposed thereon, form a unit for displaying one luminance point that is referred to as a first sub-pixel hereinafter. The second TFT Qb and the second sub-pixel electrode 191b, and the liquid crystal layer 3, the common electrode 270, and the polarizer that are disposed thereon, also form a unit for displaying one luminance point that is referred to as a second sub-pixel hereinafter. The first sub-pixel and the second sub-pixel are combined to represent one effective luminance point, and they can be considered as one pixel for this reason.

The luminance presented by one pixel is determined by image information supplied from an external device (not shown), and the image information is processed in a controller (not shown) in the LCD and converted into voltages to be applied to the first sub-pixel electrode 191a and the second sub-pixel electrode 191b. The voltages are determined such that the luminance average of the first sub-pixel and the second sub-pixel is substantially the same as the luminance represented by the image information.

The luminance of the first sub-pixel may be higher than the luminance of the second sub-pixel, and the voltage applied to the first sub-pixel electrode 191a may be higher than the voltage applied to the second sub-pixel electrode 191b with reference to the common voltage in the case of a normally black mode.

The first/second sub-pixel electrode 191a/191b and the common electrode 270 form a first/second liquid crystal capacitor to maintain an applied voltage even after the TFTs Qa and Qb are turned off.

The first sub-pixel electrode 191a forms a storage capacitor by overlapping the storage electrode line 131 near the first opening 237a, and will be described in detail with reference to FIG. 3 and FIG. 4.

The first sub-pixel electrode 191a includes a pair of upper and lower oblique portions 194a making an angle of about 45 degrees with the gate lines 121 and the data lines 171a and 171b, and a connection 195a connecting the two oblique portions 194a to each other. The connection 195a includes a wide portion 192a having an approximate rectangle shape and narrow portions 193a connecting the wide portion 192a to the upper and lower oblique portions 194a. The wide portion 192a is wider than the narrow portions 193a and positioned between the narrow portions 193a.

The wide portion 192a is disposed inside the first opening 237a, and portions of the narrow portions 193a are disposed inside the first opening 237a and the rest of the narrow portions 193a are disposed outside the first opening 237a. The right boundary of the first sub-pixel electrode 191a extending over the oblique portion 194a, the narrow portions 193a, and the boundary of the wide portion 192a forms recesses 197, where a first recess 197 is located between the upper oblique portion 194a and the wide portion 192a, and a second recess 197 is located between the lower oblique portion 194a and the wide portion 192a. The boundary of the first opening 237a is disposed in the recesses 197, and the recesses 197 are covered by the first storage electrode 137a. As described above, the first opening 237a is also covered by the first storage electrode 137a. The recesses 197 and the first opening 237a are covered by the first storage electrode 137a to block the light leakage generated at the recesses 197 and the first opening 237a.

When designing the TFT array panel 100, appropriate gaps are placed between the boundary of the first storage electrode 137a, the boundary of the first opening 237a, and the boundary of the first sub-pixel electrode 191a as shown in FIG. 3 and FIG. 4 to take into account possibility of an alignment error between the layers and the slope of the color filter 230.

A boundary B1 of the wide portion 192a is almost parallel to a boundary B2 of the first opening 237a and is spaced apart from the boundary B2 by a predetermined distance d1. A boundary B3 of the oblique portion 194a forming a side of the recess 197 is parallel or almost parallel to the boundary B2 of the first opening 237a and is spaced apart from the boundary B2 with a predetermined distance d2. The boundary B3 of the oblique portion 194a is parallel or almost parallel to a boundary B4 of the first storage electrode 137a and is spaced apart from the boundary B4 with a predetermined distance d3.

In the TFT array panel 100 designed in the above-described manner, the wide portion 192a of the first sub-pixel electrode 191a overlaps the first storage electrode 137a only via the passivation layer 180 and gate insulating layer 140 in the first opening 237a, with an overlapping area SA that is substantially constant regardless of a misalignment. Although the narrow portions 193a partly overlap the first storage electrode 137a in the first opening 237a, the overlapping area may be changed depending on the alignment degree. However, the deviation can be ignored by designing the width of the narrow portions 193a as small as possible. Although other portions of the first sub-pixel electrode 191a including the narrow portions 193a may overlap the first storage electrode 137a, the capacitance related thereto is relatively small since the color filter 230 is disposed therebetween.

Therefore, the effective capacitance of the storage capacitor is determined by the area of the overlapping portion SA between the narrow portions 193a and the first storage electrode 137a, which is substantially constant regardless of a possible misalignment.

In addition, an area occupied by opaque members provided for blocking the light leakage generated near the first opening 237a becomes small such that the aperture ratio may be improved.

For example, if the first storage electrode 137a has the same size as the first opening 237a and the first sub-pixel electrode 191a to completely cover the first opening 237a, the alignment error between the panels 100 and 200 may be considered since the light leakage generated around the first opening 237a is blocked by the light blocking member 220 of the common electrode panel 200. However, the inter-panel alignment error is larger than the error due to the slope of the color filter 230, or the interlayer alignment error in the display panel 100.

For example, if it is assumed that the interlayer alignment error is about 3 µm, the slope error due to the slope of the color filter 230 is about 5 µm, and the inter-panel alignment error is about 6 µm, then, in the above-described case, the alignment error between the first storage electrode 137a and the first opening 237a is about 3 µm, the error due to the slope of the color filter 230 starting outwardly from the first opening 237a is about 5 µm, and the inter-panel alignment error is about 6 µm. When upper and lower sides of the overlapping portion SA are considered, the total of the width of about 28 µm is blackened.

However, in the present embodiment, each of d1 and d2 is about 5 µm and d3 is about 3 µm such that the total of the width of about 26 µm is blackened at the upper and lower sides of the overlapping portion SA, which is smaller than that of the previous example. Accordingly, the aperture ratio is relatively high and greater than that of a conventional TFT array panel arranged as described in the above example.

The second sub-pixel electrode 191b also overlaps the second storage electrode 137b near the second opening 237b, thereby forming a storage capacitor. The second sub-pixel electrode 191b overlaps the entire portion of the second storage electrode 137b, and the second opening 237b is covered by the second storage electrode 137b, as described above. The overlapping portion between the second sub-pixel electrode 191b and the second storage electrode 137b may be designed as that between the first sub-pixel electrode 191a and the first storage electrode 137a. However, since the luminance of the second sub-pixel is smaller than the luminance of the first sub-pixel such that the influence by the deviation of the storage capacitance on the luminance is relatively small, the present embodiment is designed to ensure the aperture ratio rather than reducing the deviation of the storage capacitance.

The left boundary of the second sub-pixel electrode 191b is spaced apart from the right boundary of the wide portion 192a by a sufficient distance d4 to prevent a short-circuit therebetween.

Now, storage capacitors of LCDs according to other exemplary embodiments of the present invention will be described with reference to FIG. 5 to FIG. 7.

Figure 5:
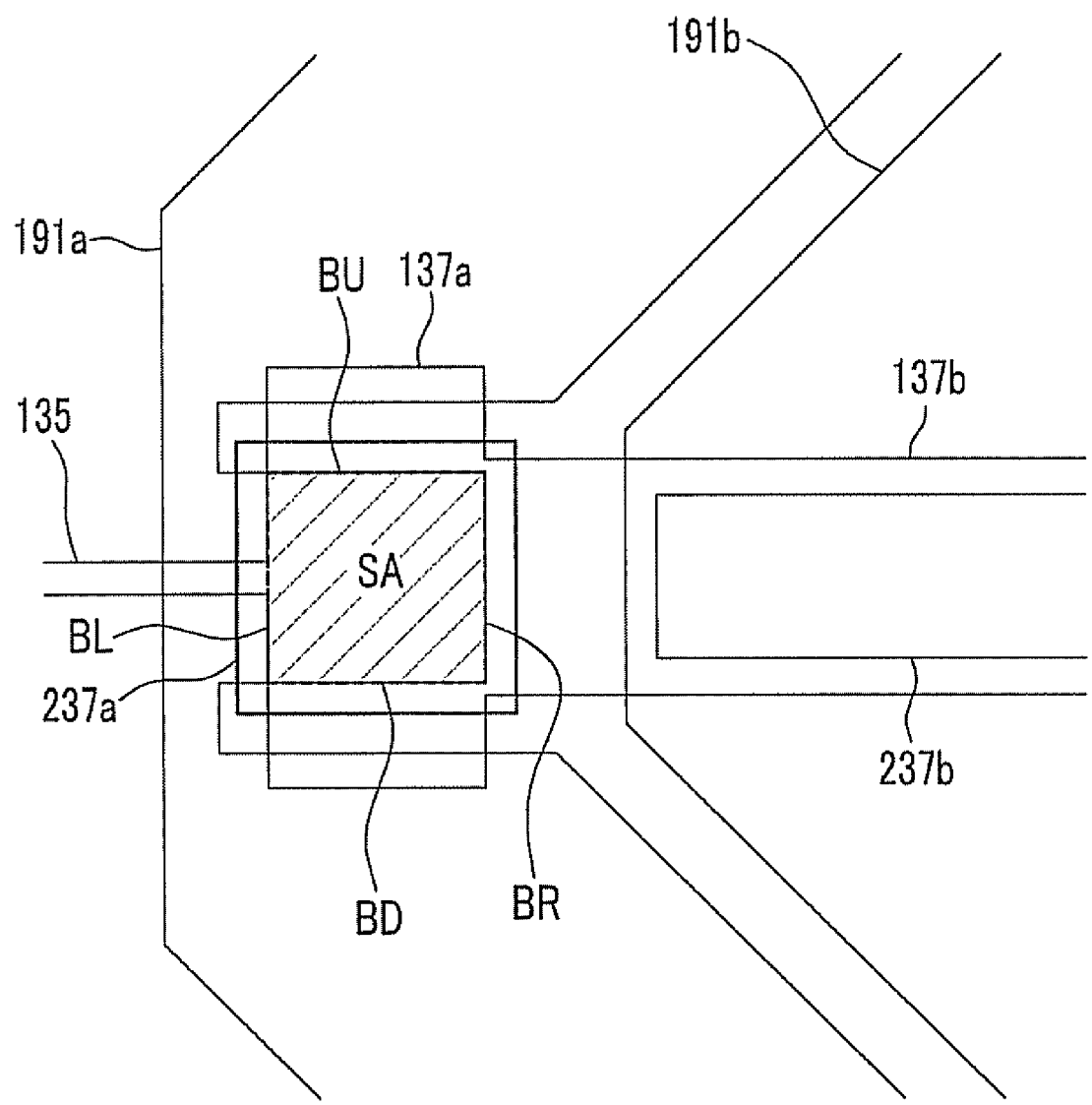
Figure 6:
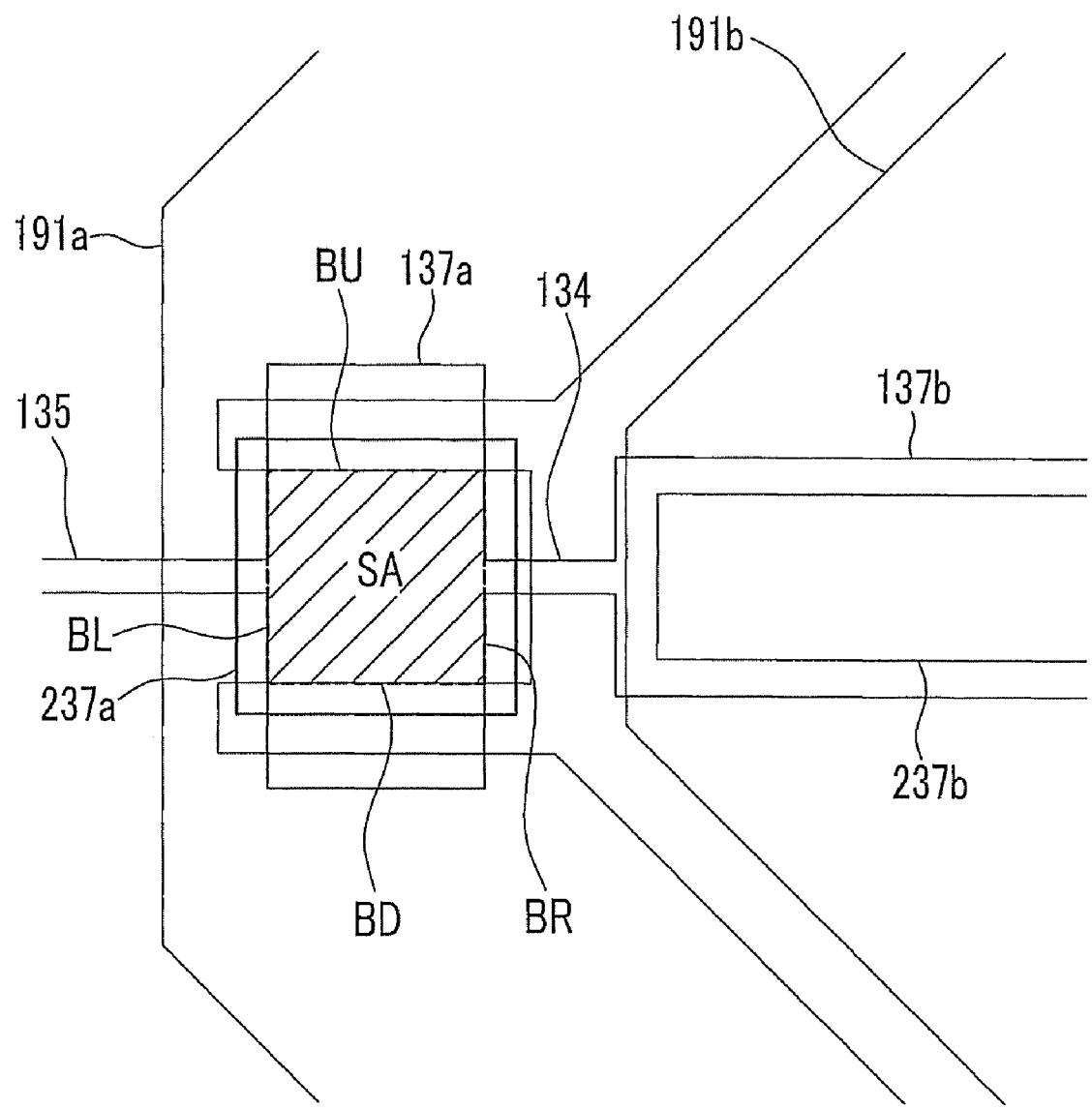
Figure 7:
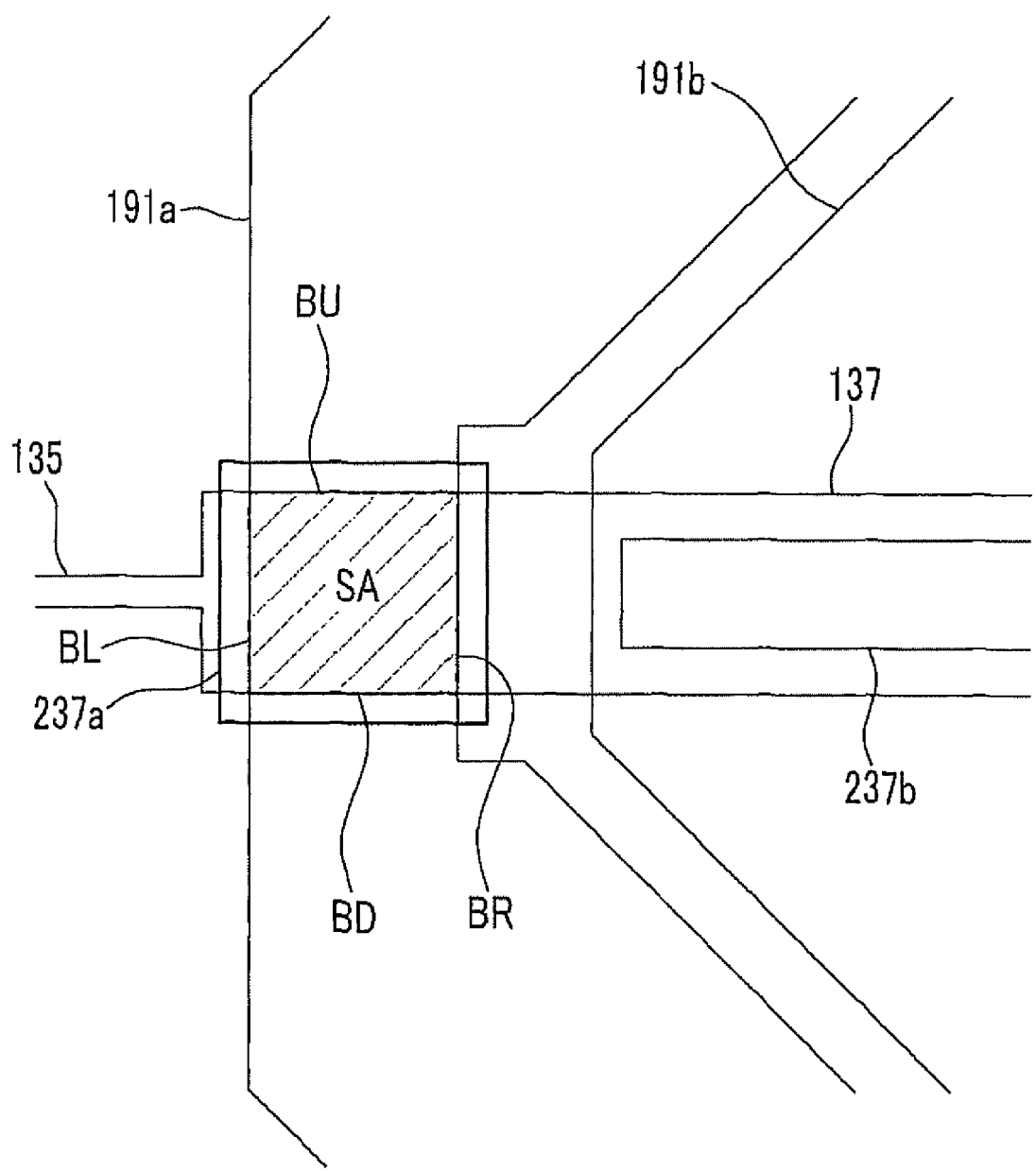

FIG. 5 to FIG. 7 are layout views of exemplary storage capacitors of exemplary LCDs according to other exemplary embodiments of the present invention.

Referring to FIG. 5 to FIG. 7, overlapping portions between the first storage electrode 137a and the first sub-pixel electrode 191a are denoted by reference characters "SA", and the upper, lower, left, and right boundaries thereof are denoted by reference characters "BU", "BD", "BL", and "BR," respectively. The remaining reference numerals or characters are the same as those of FIG. 1 to FIG. 4.

As shown in FIG. 5 to FIG. 7, each of rectangular overlapping portions SA is disposed in the first opening 237a, and the area of the overlapping portion SA is determined by required storage capacitance.

In FIG. 5, the upper, lower, and right boundaries BU, BD, BR of the overlapping portion SA are boundaries of the first sub-pixel electrode 191a, and the left boundary BL of the overlapping portion SA is a boundary of the first storage electrode 137a. Therefore, the left boundary of the first sub-pixel electrode 191a and the narrow portions of the connection of the first sub-pixel electrode 191a are disposed outside the first opening 237a.

In FIG. 6, the upper and lower boundaries BU and BD of the overlapping portion SA are boundaries of the wide portion of the connection of the first sub-pixel electrode 191a, and the left and right boundaries BL and BR are boundaries of the first storage electrode 137a. Therefore, the left and right boundaries of the first sub-pixel electrode 191a are disposed outside the first opening 237a. A narrow connection 134 is provided for connecting the first storage electrode 137a to the second storage electrode 137b disposed at the right side of the first storage electrode 137a.

In FIG. 7, the left and right boundaries BL and BR of the overlapping portion SA are boundaries of a connection of the first sub-pixel electrode 191a, and the upper and lower boundaries BU and BD thereof are boundaries of the storage electrode 137, in contrast with FIG. 6. Also in FIG. 7, the two storage electrodes are indicated by a single reference numeral "137" since the widths of the first storage electrode 137a and the second storage electrode 137b are the same. However, it is optional for the widths of the first storage electrode 137a and the second storage electrode 137b to be different. Furthermore, the connection of the first sub-pixel electrode 191a has a uniform width without wide and narrow portions, and without recesses formed therebetween, since the first sub-pixel electrode 191a does not need to define the upper and lower boundaries of the overlapping portion SA.

In FIG. 5 to FIG. 7, the distances between the boundaries of the first sub-pixel electrode 191a, the storage electrodes 137a and 137b or 137, and the first opening 237a are designed considering the alignment errors as described above. In this way, at least a portion of the boundary of the first sub-pixel electrode 191a is disposed in the first opening 237a, when designing the storage capacitor, such that the storage electrodes 137 or 137a and 137b block the light leakage generated near the corresponding portion without accompanying the light blocking member 220 of the common electrode panel 200. Accordingly, the aperture ratio is improved.

While an LCD is described as incorporating the TFT array panel 100 having the above-described storage capacitors, the structures of the storage capacitors shown in FIG. 3 to FIG. 7 may be adapted to other display devices as well as the LCD.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
    a substrate;
    a first storage electrode disposed on the substrate;
    a first thin film transistor disposed on the substrate and separated from the first storage electrode;
    a first insulating layer disposed on the first storage electrode and the first thin film transistor and having a first opening disposed on the first storage electrode;
    a pixel electrode connected to the first thin film transistor and overlapping the first storage electrode in the first opening; and
    a second insulating layer interposed between the first storage electrode and the pixel electrode in the first opening,
    wherein at least a portion of one boundary of the pixel electrode overlaps the first storage electrode and lies in the first opening; and
    wherein at least a portion of one boundary of the first storage electrode lies in the first opening.

2. The thin film transistor array panel of claim 1, wherein the first insulating layer comprises a color filter.

3. The thin film transistor array panel of claim 2, wherein at least a portion of one boundary of the first opening overlaps the first storage electrode.

4. The thin film transistor array panel of claim 3, wherein:
    the first opening, the first storage electrode, and an overlapping area between the first storage electrode and the pixel electrode are substantially rectangular; and
    the overlapping area lies in the first opening.

5. The thin film transistor array panel of claim 4, wherein the pixel electrode comprises a first portion that is rectangular and overlaps the first opening, a second portion disposed outside the first opening, and a third portion connecting the first portion and the second portion and having a narrower width than the first portion.

6. The thin film transistor array panel of claim 5, wherein the first portion of the pixel electrode lies within the first opening and boundaries of the first opening lie within boundaries of the first storage electrode.

7. The thin film transistor array panel of claim 5, wherein the overlapping area between the first storage electrode and the pixel electrode is formed by three edges of the first portion of the pixel electrode and one edge of the first storage electrode.

8. The thin film transistor array panel of claim 5, wherein the overlapping area between the first storage electrode and the pixel electrode is formed by two opposite edges of the first portion of the pixel electrode and two opposite edges of the first storage electrode.

9. The thin film transistor array panel of claim 5, wherein the second portion of the pixel electrode has an edge substantially parallel to an edge of the first opening and overlapping the first storage electrode.

10. The thin film transistor array panel of claim 9, wherein the third portion of the pixel electrode overlaps the first storage electrode.

11. The thin film transistor array panel of claim 3, wherein the pixel electrode comprises:
    a first sub-pixel electrode connected to the first thin film transistor and overlapping the first storage electrode in the first opening, and a second sub-pixel electrode separated from the first sub-pixel electrode.

12. The thin film transistor array panel of claim 11, further comprising:
a second storage electrode connected to the first storage electrode and overlapping with the second sub-pixel electrode; and
a second thin film transistor separated from the second storage electrode and connected to the second sub-pixel electrode,
wherein the first insulating layer has a second opening disposed on the second storage electrode, and
the second insulating layer is interposed between the second storage electrode and the second sub-pixel electrode in the second opening.

13. The thin film transistor array panel of claim 12, wherein boundaries of the second sub-pixel electrode are disposed outside boundaries of the second opening.

14. The thin film transistor array panel of claim 13, wherein a width of the first storage electrode is greater than a width of the second storage electrode, and a length of the first storage electrode is smaller than a length of the second storage electrode.

15. The thin film transistor array panel of claim 14, wherein:
a boundary of the first storage electrode is overlapped by a boundary of the first opening; and
the second storage electrode and the first storage electrode are connected to each other through a connection having a narrower width than the second storage electrode and extending from a boundary of the first storage electrode.

16. The thin film transistor array panel of claim 13, wherein a width of the second storage electrode is substantially equal to a width of the first storage electrode.

17. The thin film transistor array panel of claim 13, wherein a voltage of the first sub-pixel electrode and a voltage of the second sub-pixel electrode are derived from one image information inputted from an external device; and the voltage of the first sub-pixel electrode is higher than the voltage of the second sub-pixel electrode relative to a predetermined voltage.

18. The thin film transistor array panel of claim 17, wherein the first sub-pixel electrode has a smaller area than the second sub-pixel electrode.

19. The thin film transistor array panel of claim 1, wherein an overlapping area between the first storage electrode and the pixel electrode has boundaries forming a closed region in the first opening.

20. The thin film transistor array panel of claim 19, further comprising a connection connected to the first storage electrode, the connection having a narrower width than the first storage electrode, and overlapping one boundary of the first opening.

21. A thin film transistor array panel comprising:
a substrate:
a first storage electrode disposed on the substrate;
a first thin film transistor disposed on the substrate and separated from the first storage electrode;
a first insulating layer disposed on the first storage electrode and the first thin film transistor and having a first opening disposed on the first storage electrode;
a pixel electrode connected to the first thin film transistor and overlapping the first storage electrode in the first opening; and
a second insulating layer interposed between the first storage electrode and the pixel electrode in the first opening,
wherein at least a portion of one boundary of the pixel electrode overlaps the first storage electrode and lies in the first opening
wherein entire
boundaries of an overlapping area between the pixel electrode and the first storage electrode in the first opening are formed by boundaries of the pixel electrode; and
wherein entire boundaries of the first storage electrode lie outside the first opening.

* * * * *